US006556432B2

(12) United States Patent
Chen et al.

(10) Patent No.: US 6,556,432 B2
(45) Date of Patent: Apr. 29, 2003

(54) DRIVE BRACKET HAVING A PIVOTABLE FASTENER

(75) Inventors: Yun Lung Chen, Taipei (TW); Kuo Chih Lin, Taipei (TW); Jung Chi Chen, Taipei (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 115 days.

(21) Appl. No.: 09/751,616

(22) Filed: Dec. 28, 2000

(65) Prior Publication Data

US 2002/0085345 A1 Jul. 4, 2002

(51) Int. Cl.[7] .................................................. G06F 1/16
(52) U.S. Cl. .................... 361/685; 361/724; 312/223.1; 439/157
(58) Field of Search ........................ 361/685, 724–727, 361/732; 439/157, 160, 159; 312/223.1, 223.2

(56) References Cited

U.S. PATENT DOCUMENTS

| 5,557,499 A | * | 9/1996 | Reiter et al. ................ 361/685 |
| 5,721,669 A | * | 2/1998 | Becker et al. ............... 361/685 |
| 5,765,933 A | * | 6/1998 | Paul et al. ................ 312/223.1 |
| 5,793,614 A | * | 8/1998 | Tollbom ...................... 361/732 |
| 5,978,212 A | * | 11/1999 | Boulay et al. ............. 361/685 |
| 6,288,902 B1 | * | 9/2001 | Kiim et al. .................. 361/725 |
| 6,351,379 B1 | * | 2/2002 | Cheng ........................ 361/685 |

* cited by examiner

*Primary Examiner*—Darren Schuberg
*Assistant Examiner*—Yean-Hsi Chang
(74) *Attorney, Agent, or Firm*—Wei Te Chung

(57) ABSTRACT

A bracket (30) for mounting a data storage device to an enclosure includes a frame (32) for mounting the data storage device therein, a fastener (34) and a shield (36). The frame defines a cutout (46) in a stop wall (38) thereof, and a pair of retaining indentions (60) in opposite side walls (40) thereof. The fastener includes a pair of pivots (72) rotatably received in the retaining indentions, a handle (62) extending through the cutout, and a spring (66) connected between the pivots. Each pivot has a latch (74) and a cam (76) engagable with stop tabs (14) formed in the enclosure, for securing the bracket in the enclosure. The shield is attached on the stop wall. When the handle is pushed upwardly, the pivots are accordingly rotated. The latches disengage from the stop tabs, and the cams move the fastener slightly away from the stop tabs.

18 Claims, 5 Drawing Sheets

DRIVE BRACKET HAVING A PIVOTABLE FASTENER

BACKGROUND

1. Field of the Invention

The present invention relates to a drive bracket, and particularly to a drive bracket having a pivotable fastener for readily attaching a data storage device to an enclosure and detaching the data storage device therefrom.

2. Related Art

A conventional hard disk drive (HDD) is directly attached to a computer enclosure with bolts. However, attachment with bolts is unduly complicated and time-consuming. Furthermore, such means of attachment does not establish any grounding paths between the HDD and the computer enclosure. Electrostatic charges can accumulate in the HDD during operation, and such charges can interfere with proper operation of the computer system.

Thus HDD brackets have been developed for mounting an HDD to a support of a computer enclosure. The bracket is made of conductive material, and comprises a base, a stop wall and a pair of side walls. A pair of tabs extends outwardly from opposite sides of the stop wall. Each tab defines a through hole corresponding to a screw hole of the support. Each side wall forms a plurality of conductive spring pins in an inner surface thereof. The HDD is mounted in the HDD bracket, and this combined assembly is secured in the support by screws which are extended through the through holes of the HDD bracket to engage with the screws holes of the support. The conductive spring pins of the HDD bracket resiliently contact the HDD, to establish grounding paths between the HDD and the computer enclosure.

However, this kind of HDD bracket is still attached to the computer enclosure with bolts, which is unduly complicated.

SUMMARY OF THE INVENTION

Accordingly, an object of the present invention is to provide a drive bracket having a pivotable fastener for readily attaching a data storage device to an enclosure and detaching the data storage device therefrom.

Another object of the present invention is to provide a drive bracket which provides grounding paths from a data storage device mounted therein to an enclosure.

To achieve the above-mentioned objects, a bracket for mounting a data storage device to an enclosure in accordance with the present invention comprises a frame for mounting the data storage device therein, a fastener and a shield. The frame comprises a base, a stop wall and a pair of side walls. The stop wall defines a cutout, and forms a bent ledge with a plurality of conductive spring tabs. Each side wall defines a guide indention and a retaining indention. The fastener comprises a pair of pivots rotatably received in the retaining indentions, a handle extending through the cutout of the stop wall and projecting outwardly from the stop wall, and a spring connected between the pivots. Each pivot has a latch and a cam engagable with stop tabs formed in a support of the enclosure, for securing the bracket in the enclosure. The shield is attached on the stop wall, for shielding the cutout. The spring tabs resiliently abut against the enclosure. When the handle is pushed upwardly, the pivots are accordingly rotated. This causes the latches to disengage from the stop tabs, and the cams to move the fastener slightly away from the stop tabs. The bracket is then easily withdrawn from the enclosure.

Other objects, advantages and novel features of the present invention will be drawn from the following detailed embodiment of the present invention with attached drawings, in which:

DESCRIPTION OF THE PREFERRED EMBODIMENT

Figure 1:
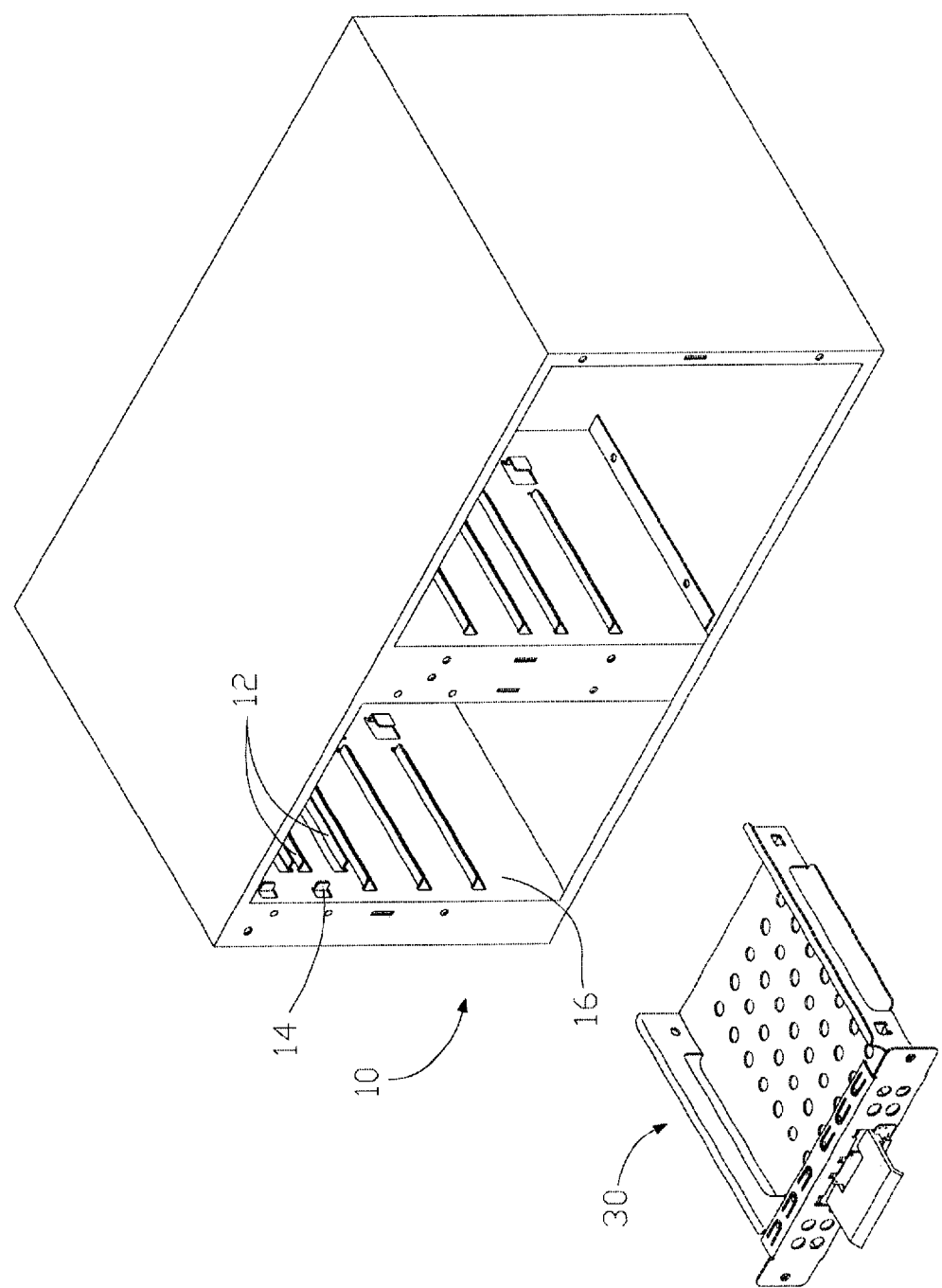
FIG. 1 is an exploded view of a hard disk drive bracket of the present invention, and a support.

FIG. 1 shows a hard disk drive (HDD) bracket 30 of the present invention to be attached to a support 10 of a computer enclosure (not shown). The support 10 defines an opening 16 for receiving the HDD bracket 30. The support 10 forms a plurality of flanges 12 at opposite sides of the opening 16. A stop tab 14 is formed in the support 10 in front of each pair of adjacent flanges 12.

Figure 2:
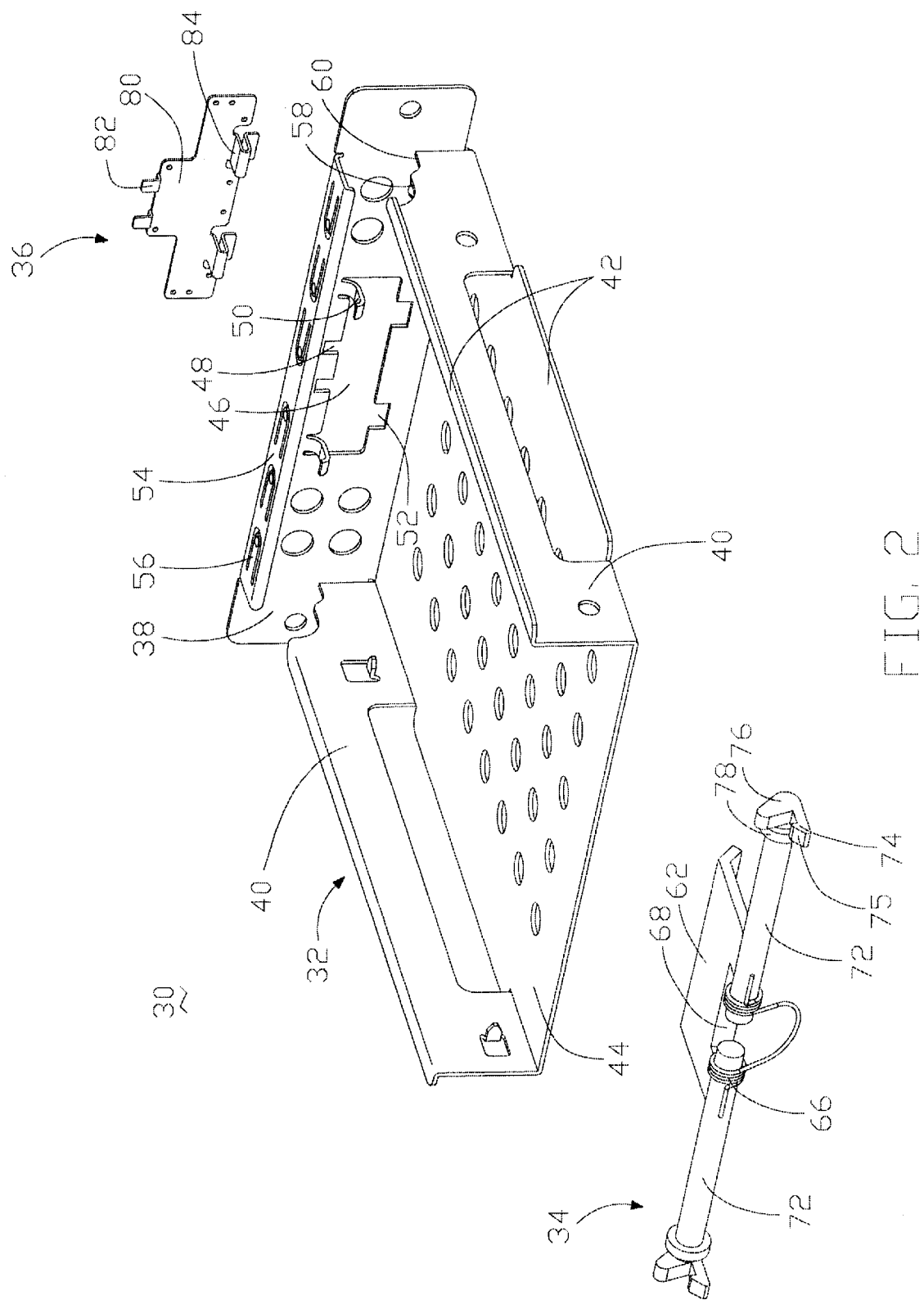
FIG. 2 is an exploded view of the hard disk drive bracket of FIG. 1.

Referring also to FIG. 2, the HDD bracket 30 comprises a frame 32, a fastener 34, and a shield 36.

The frame 32 comprises a base 44, a stop wall 38 extending upwardly from a front edge of the base 44, and a pair of side walls 40 extending upwardly from opposite side edges of the base 44 respectively. A rectangular cutout 46 is defined in a central portion of the stop wall 38. A pair of notches 48 is defined in the stop wall 38, above and in communication with the cutout 46. A pair of elastic tabs 50 extends inwardly from an upper edge of the stop wall 38 adjacent the cutout 46, on opposite sides of the notches 48 respectively. A pair of nicks 52 is defined in the stop wall 38, below and in communication with the cutout 46. A bent ledge 54 extends inwardly from a top edge of the stop wall 38. A plurality of conductive spring tabs 56 is formed in the bent ledge 54. Each side wall 40 forms a pair of sills 42 respectively extending outwardly from top and bottom edges thereof. A guide indention 58 is defined in a top portion of each side wall 40, adjacent the stop wall 38. A retaining indention 60 is defined in each side wall 40 adjacent the stop wall 38, and in communication with the guide indention 58. A bottom extremity of the retaining indention 60 is lower than a bottom extremity of the guide indention 58.

The fastener 34 comprises a rectangular handle 62, a pair of coaxial and spaced opposing pivots 72, and a torsion spring 66. The handle 62 and the spring 66 are respectively connected to opposing inner ends of the pivots 72. An aperture 68 is defined in a central portion of a side of the handle 62 adjacent the pivots 72. Each pivot 72 forms an annular stop block 78 near an outer end thereof. A latch 74 and a cam 76 are formed at an outer end of each pivot 72, spaced slightly away from the stop block 78. The latch 74 and the cam 76 together form a general V-shape. Each latch 74 forms a slope 75 at a free end thereof.

The shield 36 is generally quadrate. A bulge 80 extends upwardly from a center portion of a top edge of the shield 36. A pair of L-shaped pins 82 extends horizontally inwardly from a top edge of the bulge 80, corresponding to the notches 48 of the frame 32. A pair of elastic bent plates 84 is inwardly formed at a bottom portion of the shield 36, corresponding to the nicks 52 of the frame 32.

Figure 3:
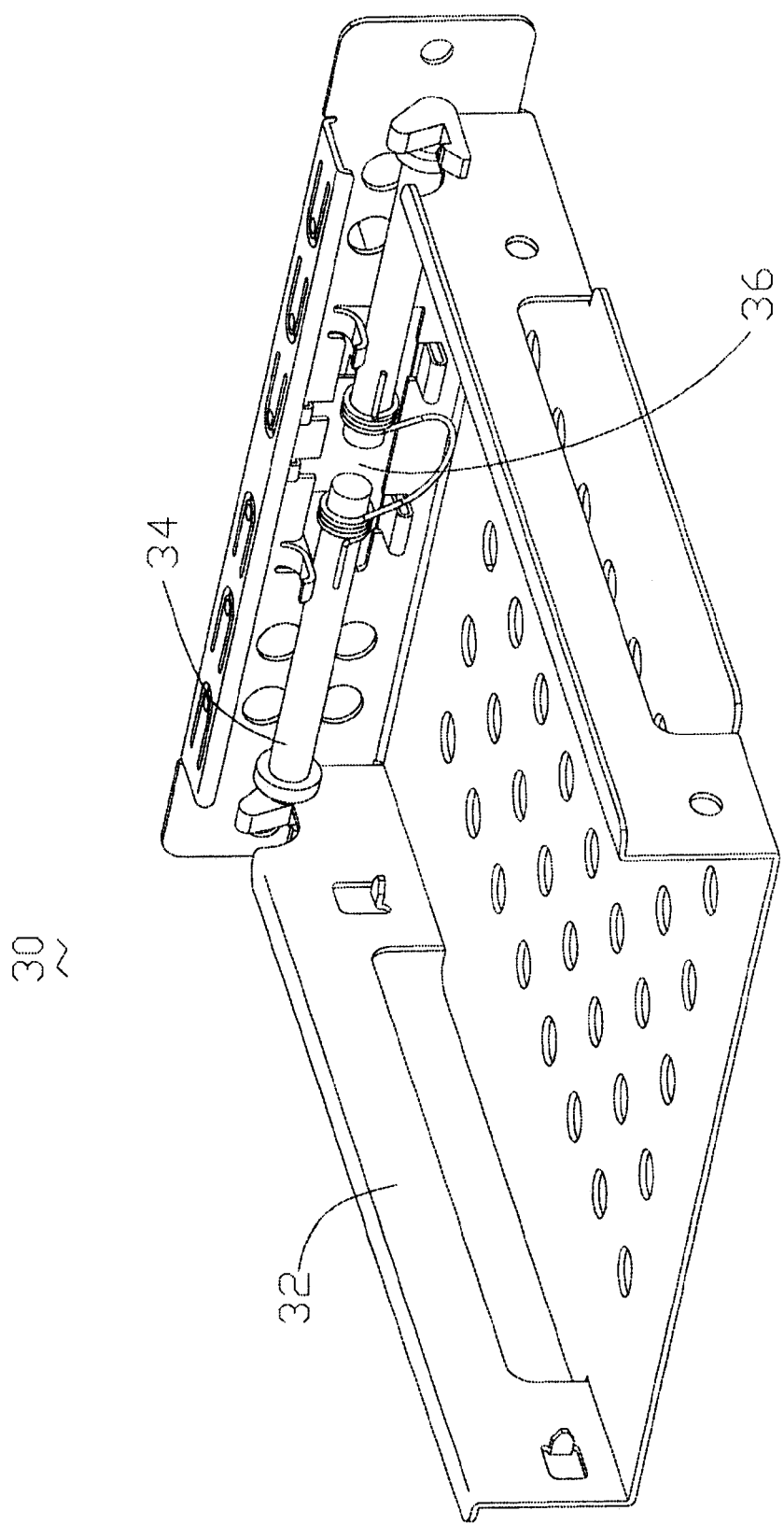
FIG. 3 is an assembled view of FIG. 2.

Referring also to FIG. 3, in assembly, the fastener 34 is placed on the side walls 40 of the frame 32. The handle 62 of the fastener 34 extends through the cutout 46 of the stop wall 38 of the HDD bracket 30. The outer end of each pivot 72 is received in the corresponding guide indention 58 of the frame 32, with the cam 76 and the stop block 78 located on opposite sides of the corresponding side wall 40. The pivots 72 are then pushed into the retaining indentions 60 of the frame 32. The pivots 72 thereby upwardly press the elastic tabs 50, causing the elastic tabs 50 to resiliently deform. The fastener 34 is thus rotatably secured between the elastic tabs 50 and the retaining indentions 60, with the handle 62 of the fastener 34 projecting outwardly from the stop wall 38. The spring 66 resiliently abuts against an inner surface of the stop wall 38, below the cutout 46. The bulge 80 of the shield 36 is extended through the aperture 68 of the handle 62, thereby preventing the handle 62 from moving downwardly. The L-shaped pins 82 of the shield 36 enter the corresponding notches 48 of the stop wall 38, and abut against the inner surface of the stop wall 38. The shield 36 is then pressed inwardly so that the elastic bent plates 84 of the shield 36 are received in the corresponding nicks 52 of the stop wall 38. The shield 36 is thus attached on the stop wall 38.

Figure 4:
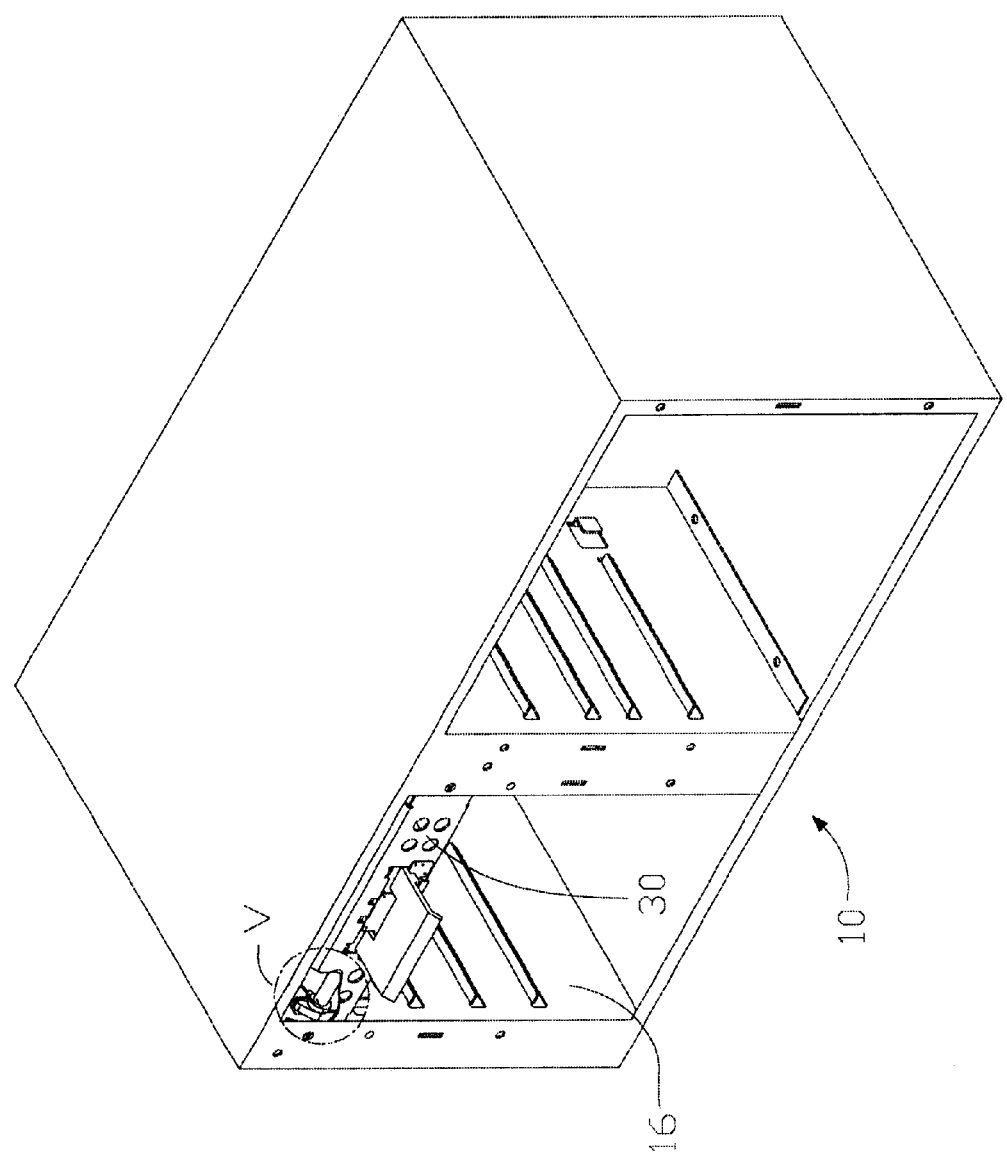
FIG. 4 is an assembled view of FIG. 1.
Figure 5:
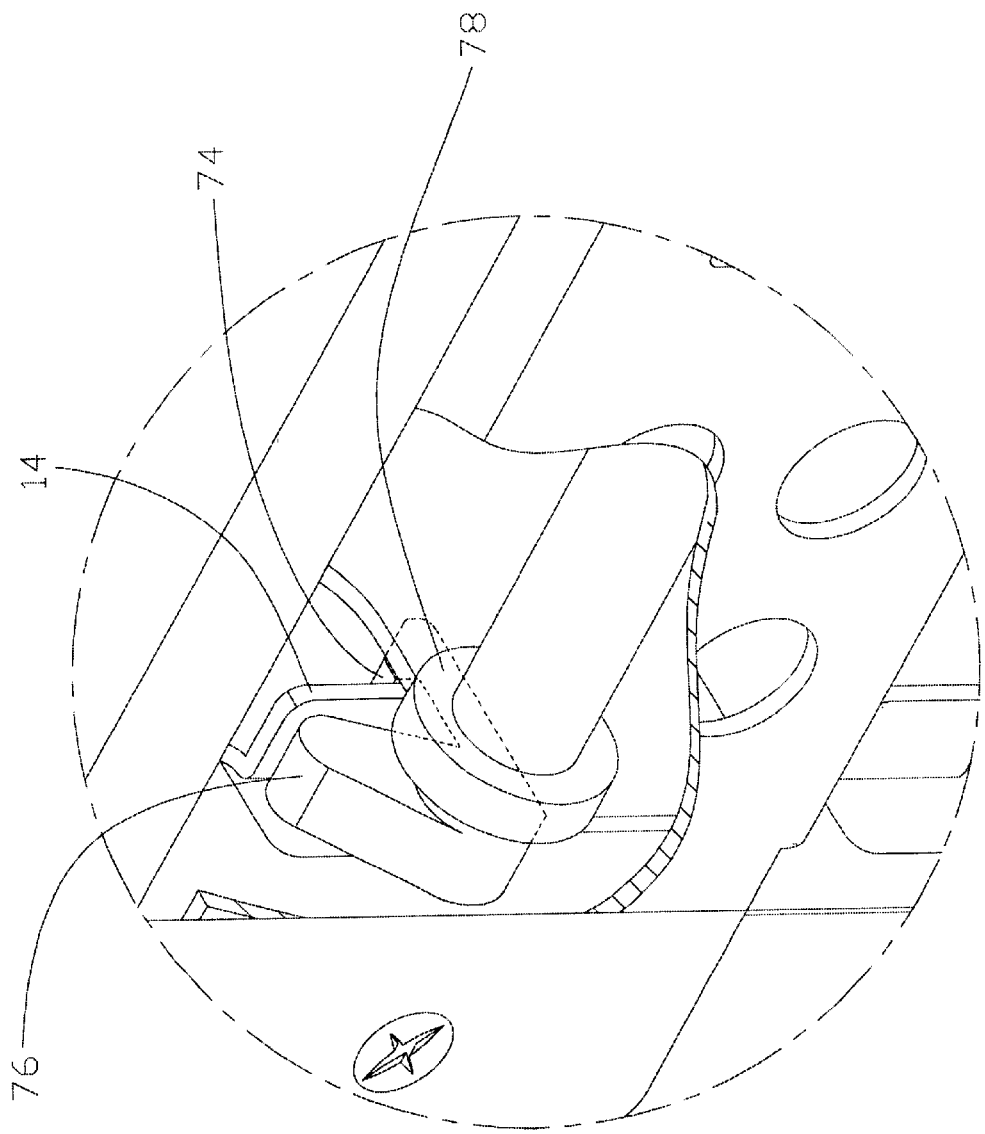
FIG. 5 is an enlarged view of the encircled portion V of FIG. 4.

Referring also to FIGS. 4 and 5, an HDD (not shown) is mounted in the HDD bracket 30 by conventional means. The HDD bracket 30 with the HDD mounted therein is then inserted into the opening 16 of the support 10. The HDD bracket 30 is guided into the support 10 by the sills 42 of the HDD bracket 30 sliding along the flanges 12 of the support 10. The HDD bracket 30 is pushed inwardly, and the slopes 75 of the latches 74 abut against bottom edges of the corresponding stop tabs 14. The slopes 75 slide along the bottom edges of the stop tabs 14, thereby causing the pivots 72 of the fastener 34 to rotate accordingly. Thus the spring 66 is rotationally stretched. The HDD bracket 30 is pushed further inwardly until the slopes 75 of the latches 74 snap over the stop tabs 14. The spring 66 elastically deforms back toward its original shape, and thereby causes the fastener 32 to rotate back toward its original position. The latches 74 are thus engaged with the stop tabs 14. Each stop tab 14 is received between the latch 74 and cam 76 of the corresponding fastener 32 (see FIG. 5). Thus the HDD bracket 30 easily mounts the HDD in the support 10. The conductive spring tabs 56 of the HDD bracket 30 resiliently abut against a corresponding portion (not labeled) of the support 10, thereby establishing a plurality of grounding paths between the HDD and the support 10.

In disassembly, the handle 62 of the HDD bracket 30 is pushed upwardly. This causes the fastener 34 of the HDD bracket 30 to rotate, and thereby rotationally stretch the spring 66. The cams 76 of the fastener 34 rotate against the stop tabs 14 of the support 10, and the latches 74 move downwardly and disengage from the stop tabs 14. The handle 62 is continued to be pushed upwardly. The cam 76 continues to rotate against the stop tabs 14, and thereby forces the fastener 34 to move slightly away from the stop tabs 14. The stop wall 38 of the HDD bracket 30 is accordingly moved slightly away from the stop tabs 14. The handle 62 is then released. The spring 66 of the fastener 34 elastically deforms back to its previous shape, and thereby causes the handle 62 to return to its original position. The HDD bracket 30 is then easily withdrawn from the opening 16 of the support 10 by using the handle 62.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A bracket for mounting a date storage device to an enclosure comprising:
    a frame for receiving a date storage device therein, the frame comprising a base, a stop wall extending from the base and a pair of side walls extending from the base; and
    a fastener rotatably attached to an inner side of the stop wall of the frame, the fastener comprising at least one pivot, and a resilient member secured to the pivot and resiliently abutting against the frame, each pivot having a latch adapted for engaging with the enclosure to thereby secure the frame in the enclosure,
    wherein the stop wall of the frame forms at least one elastic tab thereon, and at least one side wall defines a retaining indention therein, each pivot of the fastener being rotatably secured between one corresponding elastic tab and one corresponding retaining indention.

2. The bracket as described in claim 1, wherein the fastener further comprises a handle for extending through a cutout defined in the stop wall.

3. The bracket as described in claim 2, wherein each pivot further comprises a cam, and wherein when the handle is pushed upwardly, each latch is moved downwardly to disengage from a corresponding stop tab of the enclosure and each cam is rotated against the corresponding stop tab to force the fastener to move slightly away from all stop tabs, thereby disengaging the bracket from the enclosure.

4. The bracket as described in claim 2, wherein the bracket further comprises a shield adapted for shielding the cutout of the stop wall, the shield having a bulge for extending through an aperture defined in the handle of the fastener to thereby prevent the handle from moving downwardly.

5. The bracket as described in claim 4, wherein the stop wall of the frame defines at least one notch and at least one nick therein, and the shield forms at least one L-shaped pin and at least one elastic bent plate thereon, each notch receiving one corresponding L-shaped pin, and each nick receiving one corresponding elastic bent plate.

6. The bracket as described in claim 1, wherein each latch forms a slope for guiding the bracket into the enclosure in assembly.

7. The bracket as described in claim 1, wherein a stop block is formed on each pivot of the fastener near the corresponding latch, for facilitating positioning of each pivot in the corresponding retaining indention of the frame.

8. The bracket as described in claim 1, wherein at least one side wall defines a guide indention therein in communication with the corresponding retaining indention of the side wall, for guiding the corresponding pivot into the corresponding retaining indention.

9. The bracket as described in claim 1, wherein the resilient member is a torsion spring.

10. An enclosure comprising:
    a support, the support comprising an opening, a plurality of flanges on opposite sides of the opening, and at least one stop tab;
    a bracket adapted for mounting a data storage device to the enclosure through the opening of the support, the bracket comprising a frame with a plurality of sills corresponding to the flanges of the support and a fastener, the fastener having at least one cam and at least one latch to engage with a corresponding stop tab of the support and thereby secure the bracket in the support, and a resilient member resiliently abutting against the frame, wherein when the fastener is rotated each latch is disengaged from the corresponding stop tab and each cam is rotated against the corresponding stop tab to force the fastener to move slightly away from all stop tabs, thereby disengaging the bracket from the support.

11. The enclosure as described in claim 10, wherein the frame comprises a base, a stop wall extending upwardly from a front edge of the base, and a pair of side walls extending upwardly from opposite side edges of the base, and wherein the sills are formed on the side walls.

12. The enclosure as described in claim 11, wherein the fastener further comprises a handle extending through a cutout defined in the stop wall of the frame.

13. The enclosure as described in claim 12, wherein the bracket further comprises a shield adapted for shielding the cutout of the stop wall, and wherein the shield has a bulge for extending through an aperture defined in the handle to thereby prevent the handle from moving downwardly.

14. The enclosure as described in claim 10, wherein the resilient member is a torsion spring.

15. A bracket for mounting a date storage device to an enclosure comprising:

a frame for receiving a date storage device therein, the frame comprising a base, a stop wall extending from the base and a pair of side walls extending from the base, the stop wall defining a cutout;

a fastener rotatably attached to the stop wall of the frame, the fastener comprising a handle extending through the cutout and at least one pivot having a latch adapted for engaging with the enclosure to thereby secure the frame in the enclosure; and a shielding attached to the stop wall for shielding the cutout.

16. The bracket as described in claim 15, wherein the shield has a bulge extending through an aperture defined in the handle of the fastener to thereby prevent the handle from moving downwardly.

17. The bracket as described in claim 15, wherein the at least one pivot further comprises a cam, and wherein when the handle is pushed upwardly, the latch is moved downwardly to disengage from a corresponding stop tab of the enclosure and the cam is rotated against the corresponding stop tab to force the fastener to move slightly away from all stop tabs, thereby disengaging the bracket from the enclosure.

18. The bracket as described in claim 15, wherein a spring is provided around the stop wall to constantly bias the handle against the stop wall.

* * * * *